United States Patent
Arai et al.

(10) Patent No.: US 7,278,206 B2
(45) Date of Patent: Oct. 9, 2007

(54) METHOD OF PREPARING TERMINAL BOARD

(75) Inventors: Kazuhisa Arai, Tokyo (JP); Hideyuki Sando, Tokyo (JP)

(73) Assignee: Disco Corporation, Tokyo (JP)

( * ) Notice: Subject to any disclaimer, the term of this patent is extended or adjusted under 35 U.S.C. 154(b) by 309 days.

(21) Appl. No.: 10/529,146

(22) PCT Filed: Aug. 20, 2003

(86) PCT No.: PCT/JP03/10512

§ 371 (c)(1),
(2), (4) Date: Mar. 24, 2005

(87) PCT Pub. No.: WO2004/030095

PCT Pub. Date: Apr. 8, 2004

(65) Prior Publication Data

US 2006/0288826 A1 Dec. 28, 2006

(30) Foreign Application Priority Data

Sep. 25, 2002 (JP) ............................ 2002-278947

(51) Int. Cl.
*H01R 9/00* (2006.01)
(52) U.S. Cl. ............................ 29/842; 29/843; 29/874; 29/884; 451/41; 451/63
(58) Field of Classification Search .................. 29/843, 29/874, 876, 884, 885, 842; 451/41, 63
See application file for complete search history.

(56) References Cited

U.S. PATENT DOCUMENTS 6,428,393 B1  8/2002  Yukawa et al.

FOREIGN PATENT DOCUMENTS

| JP | 10-13007 | | 1/1998 |
|---|---|---|---|
| JP | 2000-173954 | * | 6/2000 |
| JP | 2001-244372 | | 9/2001 |
| JP | 2002-25948 | | 1/2002 |
| JP | 2002-203922 | | 7/2002 |

* cited by examiner

*Primary Examiner*—Carl J. Arbes
(74) *Attorney, Agent, or Firm*—Wenderoth, Lind & Ponack, L.L.P.

(57) ABSTRACT

A terminal board having a plurality of terminals on which ball electrodes are formed can be prepared efficiently and economically without having any short-circuiting between terminals when its terminals formed in very close proximity to one another, as on an interposer (1), have their heads made uniform in height by causing the terminals (4) to project from a surface of a board (2) coated with a resist film, and applying a cutting tool (19) to the surface of the board (2) having the terminals project therefrom to carry out lathe turning for the heads of the terminals (4), while having the terminal board held by a rotatable chuck table (17) and rotating the chuck table (17).

6 Claims, 4 Drawing Sheets

METHOD OF PREPARING TERMINAL BOARD

TECHNICAL FIELD

The present invention relates to a method of preparing a terminal board having a plurality of terminals on which ball electrodes are formed.

BACKGROUND ART

While a semiconductor wafer having a plurality of integrated circuits formed on its surface is divided into individual semiconductor chips by using a dicing device, etc. and usually they are individually packaged for use on various kinds of electronic devices, there have recently been developed techniques for packaging a plurality of semiconductor chips of the same kind one upon another to form a package improved in storage capacity and processing power or for packaging a plurality of semiconductor chips having different functions to form a package improved in function. And according to those techniques, semiconductor chips are mounted on boards called interposers and the interposers are mounted on a mounting board such as a printed-circuit board, so that the interposers may be interposed between the semiconductor chips and the mounting board.

Each interposer has terminals formed on its upper and lower surfaces and connected to each other by internal wiring. Each terminal on its lower surface has a ball electrode formed thereon, and while each terminal on its upper surface is connected to a bump formed on the lower surface of the semiconductor chip, the ball electrode formed on each terminal on the lower surface of the interposer is connected to an electrode (land) on the mounting board, so that the mounting board and the semiconductor chips may be electrically connected to each other. The use of such interposers makes it possible to realize a reduction in size and weight for various kinds of electronic devices.

When preparing interposers, it is necessary to make flat and uniform the heads of the terminals on the upper and lower surfaces of each interposer in order to ensure reliable connection between the terminals on its upper surface and the bumps formed on semiconductor chips or between the ball electrodes formed on its lower surface and the electrodes on the mounting board. Accordingly, there has been proposed a method employing a grinder for grinding the terminals (see, for example, JP-A-2002-203922, page 7, FIG. 11).

There has also been disclosed a method employing a cutting blade when exposing and making flat and uniform the bumps formed on the lower surface of a CSP instead of the terminals on interposers (see, for example, JP-A-2000-173954, pages 3 to 4).

Every two adjoining terminals formed on any interposer, however, unlike the bump formed on the lower surface of a CSP, have therebetween a distance of only several tens of microns which is too short to be recognized with the naked eye, and any attempt to employ a grinder for grinding the terminals and making their heads uniform in height presents the problem of the terminals being short-circuited due to the ductility of the metal forming the terminals.

Making the heads of the terminals uniform by CMP (chemical mechanical polishing) is a time-consuming job of low productivity and also presents a problem of costly disposal of liquid waste.

These problems are not limited to interposers, but are common to any terminal board having terminals formed thereon in very close proximity to one another. Therefore, it is one object of the invention to make the heads of terminals uniform in height efficiently and economically without having the terminals short-circuited in preparation of a terminal board.

SUMMARY OF INVENTION

As a specific means for achieving the above object, the present invention provides a method of preparing a terminal board having a plurality of terminals on which ball electrodes are formed, including steps of causing a plurality of terminals to project from a surface of a board coated with a resist film, and applying a cutting tool to the surface of the board having the terminals projecting therefrom to carry out lathe turning for heads of the terminals to make them uniform in height, while having the terminal board held by a rotatable chuck table and rotating the chuck table.

The lathe turning may be carried out for heads of the terminals to make them uniform in height while keeping the resist film intact. The terminal board may be an interposer to be interposed between electrodes on a semiconductor chip and electrodes on a mounting board. Also, copper electrodes may be formed as the terminals, and the cutting tool may be a single-crystal diamond tool. Favorably, the chuck table has a rotating speed of 500 rpm, and the cutting tool has a feed rate of 50 μm per revolution of the chuck table for movement from an outer periphery of the chuck table to its center of rotation and makes a cutting depth of 5 to 15 μm.

According to the method as set forth above, it is possible to carry out lathe turning for the heads of the terminals overcoming the ductility of their metal and thereby prevent any short-circuiting between any two adjoining terminals by carrying out lathe turning with a cutting tool for the terminals projecting from the resist film coating the board to make their heads uniform in height.

The lathe turning of the terminals with the resist film intact makes it possible to have the resist film support the terminals during the lathe turning and prevent the separation of any terminal or the lathe turning of terminals in an unstable position resulting in their lack of uniformity in the shape and height of their heads.

DETAILED DESCRIPTION OF THE INVENTION

Figure 1:
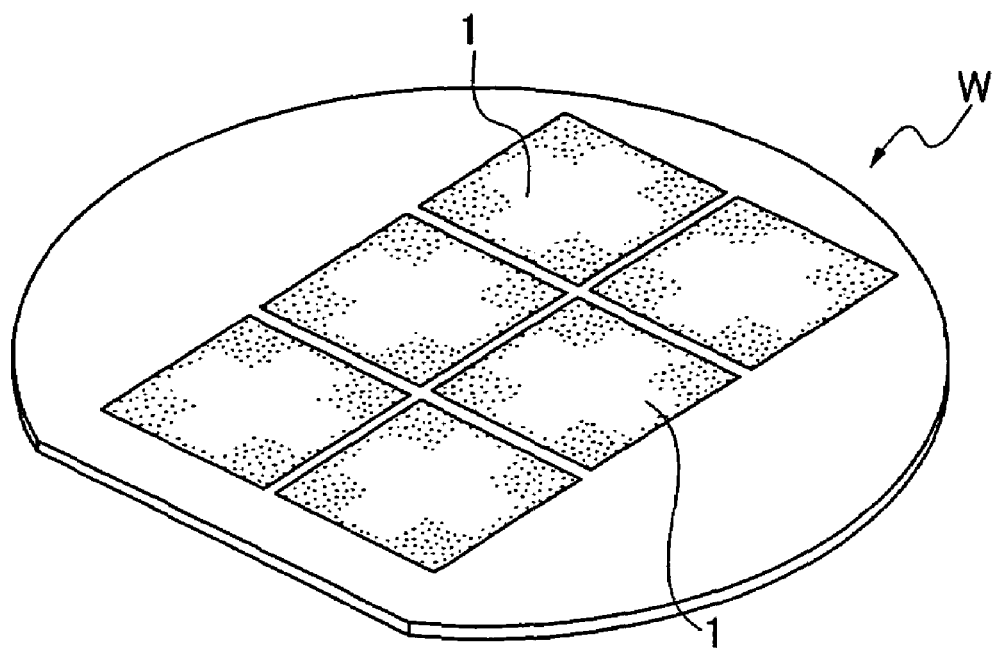
FIG. 1 is a perspective view of a wafer having interposers formed thereon to which this invention is applicable.

Description will now be made of the preparation of a wafer W having a plurality of interposers 1 formed thereon as a kind of terminal boards, as shown in FIG. 1, in order to show one mode of carrying out this invention.

Figure 2:
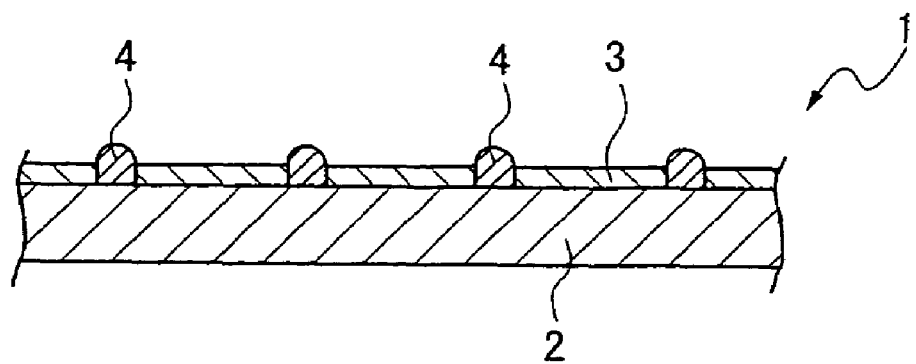
FIG. 2 is a cross sectional view of an interposer.

Each interposer 1 forming the wafer W has a plurality of terminals 4 projecting from the surface of a board 2 of e.g. silicon coated with a resist film 3 uniformly, as shown in FIG. 2. After the resist film 3 has been formed to cover one surface of the board 2, the terminals 4 are formed by removing the resist film by exposure to light from those sites at which the terminals 4 are going to be formed, and filling those sites with gold, silver or other metal forming the terminals. Each interposer 1 has terminals formed on another surface thereof, too, though they are not shown.

Figure 3:
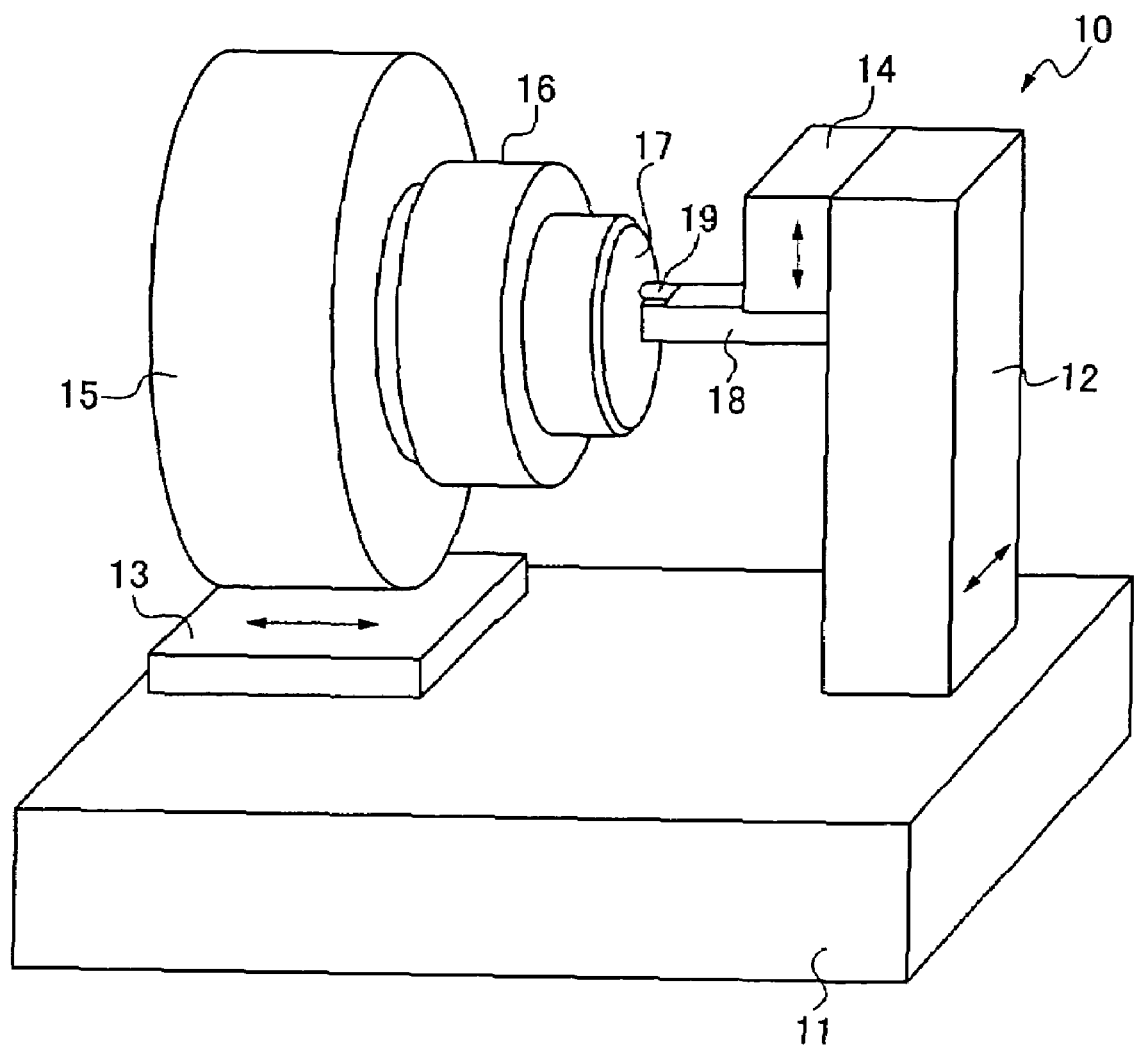
FIG. 3 is a perspective view of an example of a lathe turning apparatus used for carrying out this invention.

Then, a lathe turning apparatus 10 as shown in FIG. 3 is used to cut off the projecting portions of the terminals 4 to make their heads flat and uniform in height, so that ball electrodes can be formed thereon.

The lathe turning apparatus 10 has an X-axis moving unit 12 which is movable along the X-axis relative to a platform 11, a Y-axis moving unit 13 which is movable along the Y-axis relative to the platform 11, and a Z-axis moving unit 14 which is movable along the Z-axis relative to the X-axis moving unit 12.

The Y-axis moving unit 13 supports a spindle housing 15 and the spindle housing 15 supports a spindle 16 rotatably. The spindle 16 has a chuck table 17 mounted at its end for holding a plate-like object.

The Z-axis moving unit 14 has a cutting tool support 18 fixed thereto and, at an end of the cutting tool support 18, and a cutting tool 19 is fixed with its cutting edge facing the chuck table 17. The cutting tool 19 may, for example, be a single-crystal diamond tool.

The wafer W as shown in FIG. 1 is held on the chuck table 17. It's surface not having the terminals 4 to be cut off is held on the chuck table 17, while its surface having the terminals 4 formed thereon faces the cutting edge of the cutting tool 19.

Figure 4:
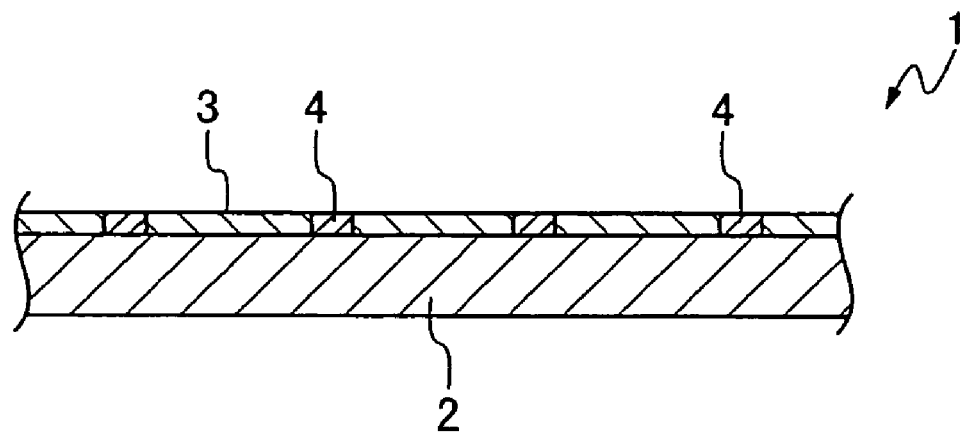
FIG. 4 is a cross sectional view of the interposer as lathe turned.

While the wafer W held on the chuck table 17 is rotated by the fast rotation of the spindle 16, the vertical movement of the cutting tool 19 is caused by the vertical movement of the Z-axis moving unit 14 and the movement of the X-axis moving unit 12 along the X-axis to cause the cutting tool to cut off the portions of the terminals 4 projecting from the resist film 3, while in contact with the surfaces of the interposers 1, whereby the terminals 4 have their heads made flat and uniform in height, as shown in FIG. 4.

It is desirable for the chuck table 17 to rotate at a speed of 500 rpm during the lathe turning. When the chuck table 17 is rotated at such a speed, the lathe turning of all the terminals 4 can be performed more effectively when the X-axis moving unit 12 is so moved that the cutting tool 19 may move at a speed of 50 μm per revolution of the chuck table 17 along the X-axis from the outer periphery of the chuck table 17 to its center of rotation.

The cutting depth of the cutting tool 19 can be controlled highly accurately by the movement along the Y-axis of the Y-axis moving unit 13 shown in FIG. 3. The cutting tool 19 may, for example, have a cutting depth of 5 to 15 μm on each terminal 4.

The use of the cutting tool 19 for cutting the heads of the terminals 4 as described does not allow the ductility of the metal of the terminals 4 to cause any short-circuiting between any two adjoining terminals, which occurs when a grindstone is used for that purpose.

Moreover, the resist film 3 surrounds the terminals 4 and holds them in position when the terminals 4 are cut at their heads, so that there may not occur any separation of any terminal 4, or any machining of the terminals in an unstable position resulting in their lack of uniformity in the shape or height of their heads.

Figure 5:
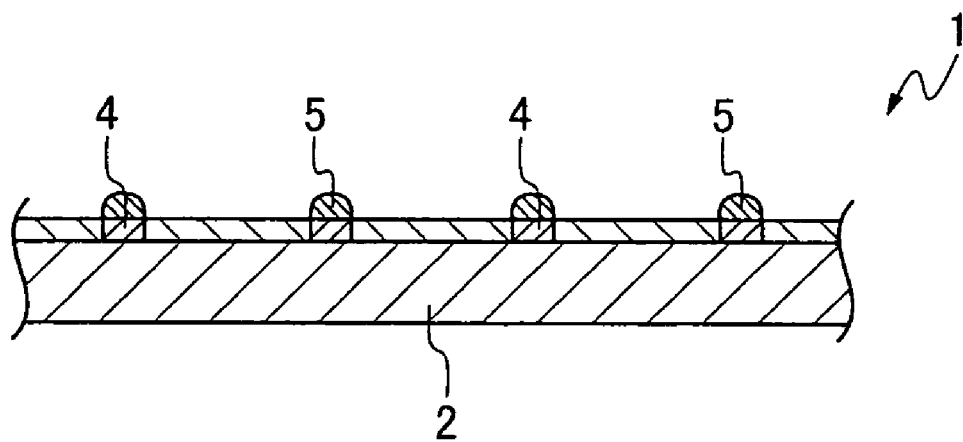
FIG. 5 is a cross sectional view of the interposer having ball electrodes formed on its terminals.

After the terminals 4 have had their heads made uniform in height, ball electrodes 5 are formed on the terminals 4, as shown, for example, in FIG. 5, whereby there are obtained interposers which can be interposed between electrodes formed on a mounting board and electrodes formed on semiconductor chips for making electrical connection between those electrodes.

The interposers 1 formed as described may be used as will now be explained. When a plurality of semiconductor chips C1, C2 and C3 are laid one upon another as shown, for example, in FIG. 6, the ball electrodes 5 formed on the terminals 4 on the upper surfaces of the interposers 1 are connected to the electrodes formed on the lower surface of the lowermost semiconductor chip C1 and the ball electrodes 6 on the lower surfaces of the interposers 1 are connected to the electrodes on a mounting board 7, such as a printed-circuit board.

Figure 7:
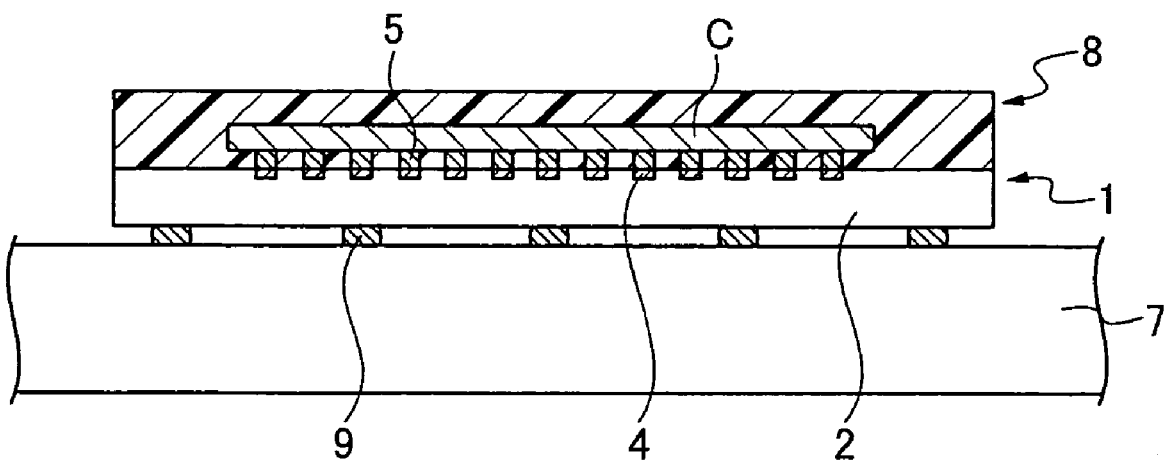
FIG. 7 is a cross sectional view showing a second mode of using the interposer.

When the interposers 1 are used for a CSP 8 as shown in FIG. 7, the ball electrodes 5 formed on the terminals 4 on the upper surfaces of the interposers 1 are connected to the electrodes formed on the lower surface of a semiconductor chip C and the ball electrodes 9 on the lower surfaces of the interposers 1 are connected to the electrodes on a mounting board 7.

Figure 6:
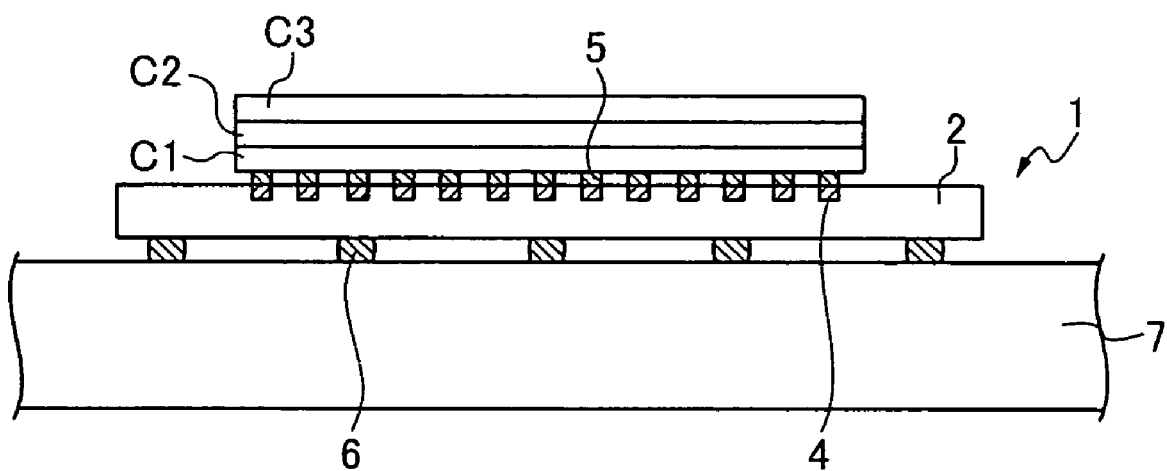
FIG. 6 is a cross sectional view showing a first mode of using the interposer as prepared by this invention.

In both of the cases shown in FIGS. 6 and 7, every two adjoining terminals 4 on the upper surfaces of the interposers 1, since they correspond to the terminals on the lower surface of the semiconductor, have therebetween a distance of only several tens of microns, which is too short to be recognized with the naked eye, to provide proper connection with the terminals on the lower surface of the semiconductor chip, but the terminals 4 made uniform in height by a cutting tool do not cause any short-circuiting therebetween like in the invention, but allow the interposers to remain effective without causing any trouble in circuit operation.

INDUSTRIAL APPLICABILITY

As described above, according to the method of preparing a terminal board of this invention, the plural terminals projecting from the resist film covering the board have their heads made uniform in height by carrying out lathe turning with a cutting tool, thereby allowing lathe turning to be carried out for the heads of the terminals by overcoming the ductility of their metal. Therefore, there does not occur any short-circuiting between any two adjoining terminals, or any trouble in the operation of any circuit formed on a semiconductor chip.

Further, the lathe turning of the terminals while keeping the resist film intact makes it possible to have the resist film support the terminals during the lathe turning and prevent the separation of any terminal or the cutting of terminals in an unstable position resulting in their lack of uniformity in the shape and height of their heads, resulting in a terminal board of low quality.

The invention claimed is:

1. A method of preparing a terminal board having a plurality of terminals on which ball electrodes are formed, comprising steps of causing a plurality of terminals to project from a surface of a board coated with a resist film, and applying a cutting tool to the surface of the board having the terminals project therefrom to carry out lathe turning for heads of the terminals to make them uniform in height, while having the terminal board held by a rotatable chuck table and rotating the chuck table, wherein the chuck table has a rotating speed of 500 rpm, and the cutting tool has a feed rate of 50 μm per revolution of the chuck table for movement from an outer periphery of the chuck table to its center of rotation and makes a cutting depth of 5 to 15 μm.

2. A method of preparing a terminal board according to claim 1, wherein the lathe turning is carried out for heads of the terminals to make them uniform in height while keeping the resist film intact.

3. A method of preparing a terminal board according to claim 2, wherein the terminal board is an interposer to be interposed between electrodes on a semiconductor chip and electrodes on a mounting board.

4. A method of preparing a terminal board according to claim 2, wherein copper electrodes are formed as the terminals, and the cutting tool is a single-crystal diamond tool.

5. A method of preparing a terminal board according to claim 1, wherein the terminal board is an interposer to be interposed between electrodes on a semiconductor chip and electrodes on a mounting board.

6. A method of preparing a terminal board according to claim 1, wherein copper electrodes are formed as the terminals, and the cutting tool is a single-crystal diamond tool.

* * * * *